United States Patent
Hoang

(10) Patent No.: US 10,741,267 B2
(45) Date of Patent: Aug. 11, 2020

(54) MEMORY CELL WITH TWO ANTI-FUSE ELEMENTS

(71) Applicant: eMemory Technology Inc., Hsin-Chu (TW)

(72) Inventor: Dung Le Tan Hoang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/435,554

(22) Filed: Jun. 9, 2019

(65) Prior Publication Data

US 2020/0051651 A1 Feb. 13, 2020

Related U.S. Application Data

(60) Provisional application No. 62/716,998, filed on Aug. 10, 2018.

(51) Int. Cl.

| | |
|---|---|
| *G11C 17/16* | (2006.01) |
| *H01L 27/112* | (2006.01) |
| *G11C 17/18* | (2006.01) |
| *H01L 23/525* | (2006.01) |
| *H03K 3/356* | (2006.01) |
| *H03K 17/284* | (2006.01) |
| *H03K 19/00* | (2006.01) |
| *H03K 19/0948* | (2006.01) |

(52) U.S. Cl.
CPC .............. *G11C 17/16* (2013.01); *G11C 17/18* (2013.01); *H01L 23/5252* (2013.01); *H01L 27/11206* (2013.01); *H03K 3/356017* (2013.01); *H03K 17/284* (2013.01); *H03K 19/0016* (2013.01); *H03K 19/0948* (2013.01)

(58) Field of Classification Search
None
See application file for complete search history.

(56) References Cited

U.S. PATENT DOCUMENTS

| | | | |
|---|---|---|---|
| 5,148,391 A | | 9/1992 | Zagar |
| 5,870,327 A | * | 2/1999 | Gitlin ....................... G11C 7/20 365/225.7 |
| 9,601,499 B2 | | 3/2017 | Wu |
| 9,613,714 B1 | | 4/2017 | Wong |
| | | (Continued) | |

FOREIGN PATENT DOCUMENTS

| | | |
|---|---|---|
| EP | 3 196 889 A1 | 7/2017 |
| TW | I569145 B | 2/2017 |

*Primary Examiner* — James G Norman
(74) *Attorney, Agent, or Firm* — Winston Hsu

(57) ABSTRACT

A memory cell includes a first anti-fuse element, a second anti-fuse element, and a selection circuit. The first anti-fuse element has a first terminal, a second terminal being floating, and a control terminal coupled to a first anti-fuse control line. The second anti-fuse element has a first terminal coupled to the first terminal of the first anti-fuse element, a second terminal being floating, and a control terminal coupled to a second anti-fuse control line. The selection circuit is coupled to the first terminal of the first anti-fuse element, the first terminal of the second anti-fuse element, and a source line. The selection circuit controls an electrical connection from the source line to the first terminal of the first anti-fuse element and the first terminal of the second anti-fuse element.

23 Claims, 6 Drawing Sheets

(56) References Cited

U.S. PATENT DOCUMENTS

| | | |
|---|---|---|
| 9,672,935 B2 | 6/2017 | Cline |
| 2002/0075744 A1 | 6/2002 | McCollum |
| 2016/0141049 A1 | 5/2016 | Song |
| 2018/0005704 A1 | 1/2018 | Takaoka |
| 2018/0315477 A1 | 11/2018 | Lin |

* cited by examiner

MEMORY CELL WITH TWO ANTI-FUSE ELEMENTS

CROSS REFERENCE TO RELATED APPLICATIONS

This non-provisional application claims priority of US provisional application No. 62/716,998, filed on Aug. 10, 2018, included herein by reference in its entirety.

BACKGROUND OF THE INVENTION

1. Field of the Invention

The present invention is related to a memory cell, and more particularly, to a memory cell with two anti-fuse elements.

2. Description of the Prior Art

In a memory system, to identify the value of data stored in a memory cell, a sensing amplifier is often used to compare the data voltage generated by the memory cell with a reference voltage. For example, if the data voltage is higher than the reference voltage, the sensing amplifier will output a high voltage level indicating the value of data stored in the memory cell is "0". Otherwise, if the data voltage is lower than the reference voltage, the sensing amplifier will output a low voltage level indicating the value of data stored in the memory cell is "1". The voltage level outputted by the sensing amplifier will be stored by a latch for later access.

However, transistors of different sensing amplifiers may have different threshold voltages due to characteristic variation caused during the manufacturing process; therefore, it is difficult to choose a proper reference voltage for identifying the data. The ideal reference voltage for one memory cell can be inappropriate for another memory cell, which may increase the data reading time and/or cause a false reading result.

SUMMARY OF THE INVENTION

One embodiment of the present invention discloses a memory cell. The memory cell includes a first anti-fuse element, a second anti-fuse element, and a selection circuit.

The first anti-fuse element has a first terminal, a second terminal being floating, and a control terminal coupled to a first anti-fuse control line. The second anti-fuse element has a first terminal coupled to the first terminal of the first anti-fuse element, a second terminal being floating, and a control terminal coupled to a second anti-fuse control line. The selection circuit is coupled to the first terminal of the first anti-fuse element, the first terminal of the second anti-fuse element, and a source line. The selection control circuit controls an electrical connection from the source line to the first terminal of the first anti-fuse element and the first terminal of the second anti-fuse element.

Another embodiment of the present invention discloses a memory system. The memory system includes a plurality of first anti-fuse control lines, a plurality of second anti-fuse control lines, a plurality of source lines, and a plurality of memory cells.

A memory cell of the plurality of memory cells includes a first anti-fuse element, a second anti-fuse element, and a selection circuit. The first anti-fuse element has a first terminal, a second terminal being floating, and a control terminal coupled to a corresponding first anti-fuse control line of the plurality of first anti-fuse control lines. The second anti-fuse element has a first terminal coupled to the first terminal of the first anti-fuse element, a second terminal being floating, and a control terminal coupled to a corresponding second anti-fuse control line of the plurality of second anti-fuse control lines. The selection circuit is coupled to the first terminal of the first anti-fuse element, the first terminal of the second anti-fuse element, and a first source line. The selection control circuit controls an electrical connection from the first source line to the first terminal of the first anti-fuse element and the first terminal of the second anti-fuse element.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
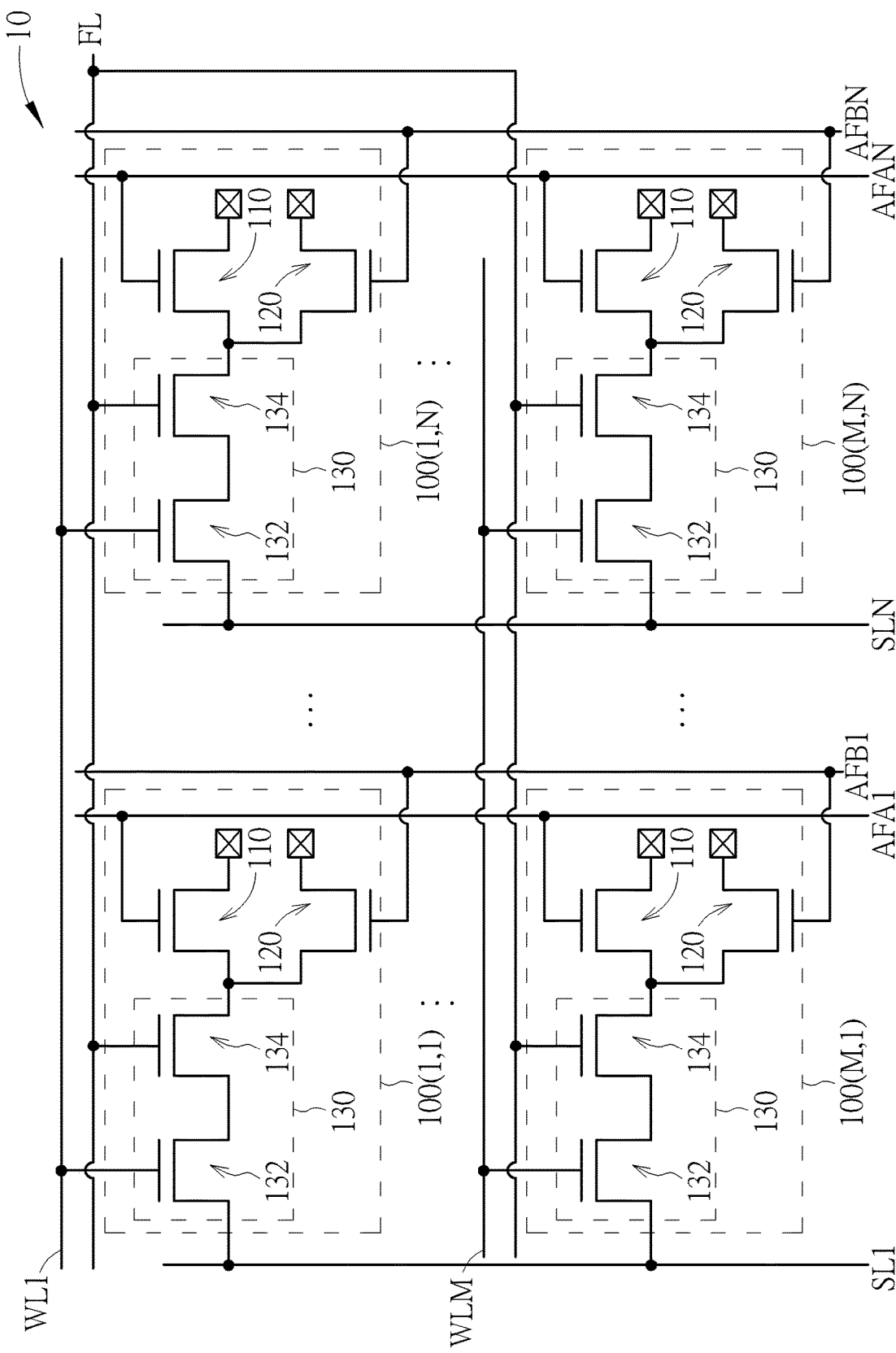
FIG. 1 shows a memory system according to one embodiment of the present invention.

FIG. 1 shows a memory system 10 according to one embodiment of the present invention. The memory system 10 includes a plurality of first anti-fuse control lines AFA1 to AFAN, a plurality of second anti-fuse control lines AFB1 to AFBN, a plurality of source lines SL1 to SLN, a plurality of word lines WL1 to WLM, a following gate control line FL, and a plurality of memory cells 100(1,1) to 100(M,N).

In FIG. 1, the memory cells 100(1,1) to 100(M,N) can be disposed as an array and can be coupled to the same following gate control line FL. Also, memory cells disposed in the same row are coupled to the same word line, and memory cells disposed in the same column are coupled to the same first anti-fuse control line, the same second anti-fuse control line, and the same source line. For example, the memory cells 100(1,1) to 100(1,N) are coupled to the word line WL1 while the memory cells 100(M,1) to 100(M,N) are coupled to the word line WLM. Also, the memory cells 100(1,1) to 100(M,1) are coupled to the first anti-fuse control line AFA1, the second anti-fuse control line AFB1, and the source line SL1 while the memory cells 100(1,N) to 100(M,N) are coupled to the first anti-fuse control line AFAN, the second anti-fuse control line AFBN, and the source line SLN.

In FIG. 1, the memory cells 100(1,1) to 100 (M,N) can have the same structure and can be operated with the same principles. For example, the memory cell 100(1,1) includes a first anti-fuse element 110, a second anti-fuse element 120, and a selection circuit 130.

The first anti-fuse element 110 has a first terminal, a second terminal being floating, and a control terminal coupled to the first anti-fuse control line AFA1. The second anti-fuse element 120 has a first terminal coupled to the first terminal of the first anti-fuse element 110, a second terminal being floating, and a control terminal coupled to the second anti-fuse control line AFB1. In some embodiments, the first anti-fuse element 110 and the second anti-fuse element 120 can be anti-fuse varactors implemented by transistors as shown in FIG. 1.

The selection circuit 130 is coupled to the first terminal of the first anti-fuse element 110, the first terminal of the second anti-fuse element 120, and the source line SL1. The selection circuit 130 can control the electrical connection from the source line SL1 to the first terminal of the first anti-fuse element 110 and the first terminal of the second anti-fuse element 120.

For example, the selection circuit 130 can include a select transistor 132 and a following gate transistor 134. The select transistor 132 has a first terminal coupled to the source line SL1, a second terminal, and a control terminal coupled to the word line WL1. The following gate transistor 134 has a first terminal coupled to the second terminal of the select transistor 132, a second terminal coupled to the first terminal of the first anti-fuse element 110 and the first terminal of the second anti-fuse element 120, and a control terminal coupled to the following gate control line FL.

In some embodiments, the memory cell 100(1,1) can be programmed with two different types of data. Also, during the program operation of the memory cell 100(1,1) for each type of data, the first anti-fuse element 110 and the second anti-fuse element 120 can be programmed with different voltages to store complementary data. Consequently, during the read operation of the memory cell 100(1,1), the first anti-fuse element 110 and the second anti-fuse element 120 may generate different voltages, so a sensing amplifier can compare the voltage difference without using reference voltages, thereby improving the accuracy of the read operation and reducing the reading time.

Figure 2:
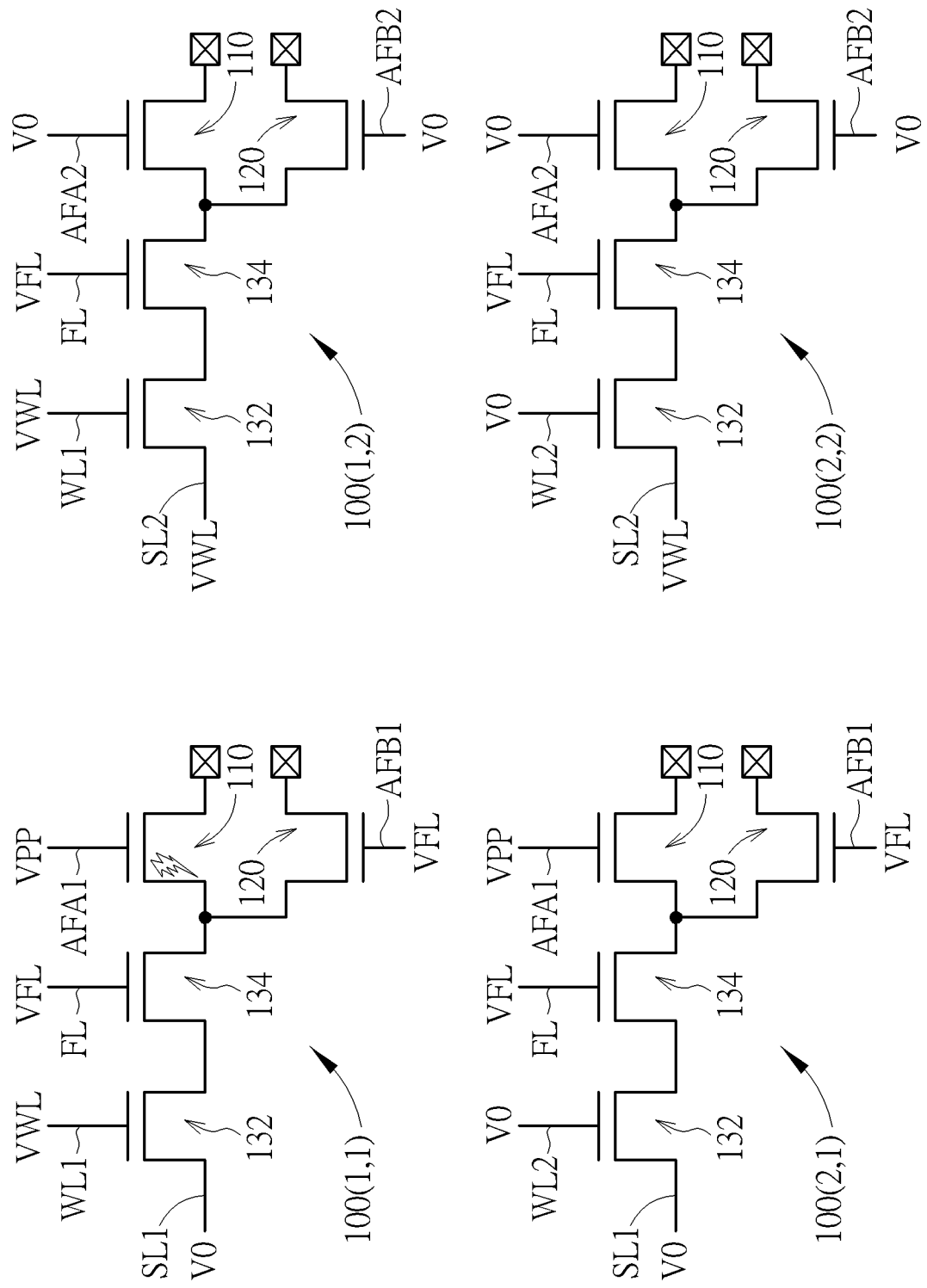
FIG. 2 shows voltages received by the memory cells in FIG. 1 during the program operation for programming a first type of data.

FIG. 2 shows voltages received by the memory cells 100(1,1), 100(1,2), 100(2,1), and 100(2,2) during the program operation of the memory cell 100(1,1) for programming a first type of data. For example, in FIG. 2, the first type of data, for example but not limited to "0", can be represented by having the first anti-fuse element 110 being ruptured and having the second anti-fuse element 120 not being ruptured.

In this case, during the program operation for the first type of data, the first anti-fuse control line AFA1 can be at a voltage VPP, the second anti-fuse control line AFB1 can be at a voltage VFL, the following gate control line FL can be at the voltage VFL, the word line WL1 can be at a voltage VWL, the source line SL1 can be at a voltage V0. In some embodiments, the voltage VPP is greater than the voltage VFL, the voltage VFL is greater than voltage VWL, and the voltage VWL is greater than the voltage V0. For example, the voltage VPP can be 5 to 6V, the voltage VFL can be 2V, the voltage VWL can be 1.4V, and the voltage V0 can be 0V.

Therefore, during the program operation in FIG. 2, the select transistor 132 and the following gate transistor 134 of the memory cell 100(1,1) will be turned on, and the first terminals of the anti-fuse elements 110 and 120 will receive the voltage V0 through the select transistor 132 and the following gate transistor 134. In this case, since the first anti-fuse control line AFA1 is at the voltage VPP, the large voltage between the first terminal and the control terminal of the first anti-fuse element 110 will rupture the first anti-fuse element 110. However, since the second anti-fuse control line AFB1 is at the voltage VFL smaller than the voltage VPP, the voltage between the first terminal and the control terminal of the second anti-fuse element 120 will not be large enough to rupture the second anti-fuse element 120. Therefore, after the program operation for the first type of data, the first anti-fuse element 110 will be ruptured while the second anti-fuse element 120 will not be ruptured.

Figure 3:
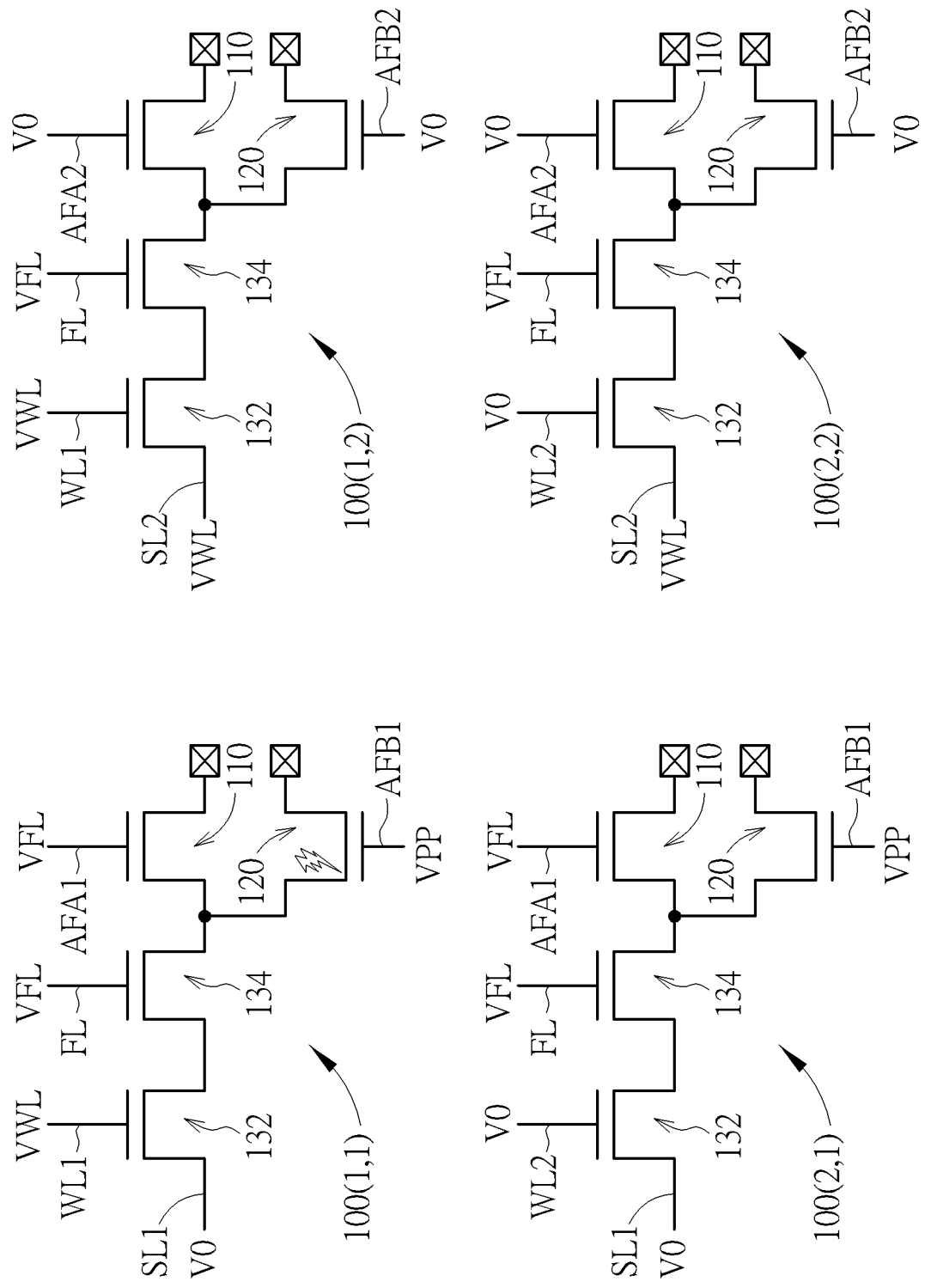
FIG. 3 shows voltages received by the memory cells in FIG. 1 during the program operation for programming a second type of data.

FIG. 3 shows voltages received by the memory cells 100(1,1), 100(1,2), 100(2,1), and 100(2,2) during the program operation of the memory cell 100(1,1) for programming a second type of data. For example, in FIG. 3, the second type of data, for example but not limited to "1", can be represented by having the first anti-fuse element 110 not being ruptured and having the second anti-fuse element 120 being ruptured.

In this case, the program operation shown in FIG. 3 is similar to the program operation shown in FIG. 2. However, the second anti-fuse control line AFB1 would be at the voltage VPP, and the first anti-fuse control line AFA1 can be at the voltage VFL. Consequently, the first anti-fuse element 110 will not be ruptured while the second anti-fuse element 120 will be ruptured, representing the second type of data.

Furthermore, in FIGS. 2 and 3, the memory cells 100(1,2), 100(2,1), and 100(2,2) should not be programmed during the program operation of the memory cell 100(1,1). Therefore, during the program operation of the memory cell 100(1,1) as shown in FIGS. 2 and 3, the word line WL2 coupled to the memory cell 100(2,1) can be at the voltage V0, and the source line SL2 coupled to the memory cell 100(1,2) can be at the voltage VWL.

In this case, the select transistor 132 of the memory cell 100(2,1) will be turned off, so the anti-fuse elements 110 and 120 of the memory cell 100(2,1) will not be ruptured. Furthermore, in FIGS. 2 and 3, the anti-fuse control lines AFA2 and AFB2 can both be at the voltage V0, ensuring that the anti-fuse elements 110 and 120 of the memory cell 100(2,1) will not be programmed during the program operation of the memory cell 100(1,1).

In addition, since the source line SL2 is at the voltage VWL, the select transistor 132 of the memory cell 100(1,2) will also be turned off, so the anti-fuse elements 110 and 120 of the memory cell 100(2,1) will not receive the low voltage through the select transistor 132 and the following gate transistor 134, and both of the anti-fuse elements 110 and 120 of the memory cell 100(2,1) will not be ruptured. Similarly, the memory cell 100(2,2) will not be programmed during the program operation of the memory cell 100(1,1).

Consequently, during the program operation of memory cell 100(1,1) as shown in FIGS. 2 and 3, the memory cells 100(1,2), 100(2,1), and 100(2,2) can be inhibited from being programmed.

Figure 4:
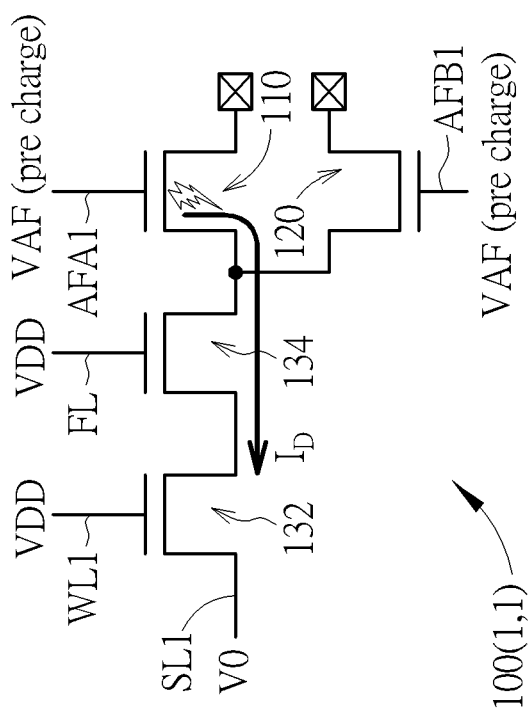
FIG. 4 shows voltages received by the memory cell in FIG. 1 during the read operation.

FIG. 4 shows voltages received by the memory cell 100(1,1) during the read operation of the memory cell 100(1,1). During the read operation of the memory cell 100(1,1), the first anti-fuse control line AFA1 and the second anti-fuse control line AFB1 will be pre-charged to a voltage VAF. After the first anti-fuse control line AFA1 and the second anti-fuse control line AFB1 are pre-charged to the voltage VAF, the pre-charge process will be stopped. Also, the following gate control line FL and the word line WL1 would be at a voltage VDD, and the source line SL1 would be at the voltage V0. In some embodiments, the voltage VAF can be greater than the voltage VDD, and the voltage VDD can be greater than the voltage V0. For example, the voltage VAF can be 1.3V, the voltage VDD can be 0.9V, and the voltage V0 can be 0V.

In FIG. 4, if the first anti-fuse element 110 has been ruptured by the program operation as shown in FIG. 2, then a discharging current $I_D$ will be generated and flow from the first anti-fuse control line AFA1 to the source line SL1. Therefore, the voltage of the first anti-fuse control line AFA1 will be pulled down. However, since the second anti-fuse element 120 is not ruptured, no discharge current path will be generated at the second anti-fuse element 120, so the voltage of the second anti-fuse control line AFB1 will remain at the voltage VAF.

In another embodiment, if the first anti-fuse element 110 is not ruptured while the second anti-fuse element 120 is ruptured by the program operation as shown in FIG. 3, then the discharging current path will be formed at the second anti-fuse element 120, and the voltage of the second anti-fuse control line AFB1 will be pulled down.

Consequently, by sensing the voltage difference between the first anti-fuse control line AFA1 and the second anti-fuse control line AFB1, the data stored in the memory cell 100(1,1) can be read. Since the data can be read by the differential voltage between the anti-fuse control lines AFA1 and AFB1, the speed of the read operation can be raised. Also, without using any reference voltages or reference currents, the reading accuracy can be improved.

Figure 5:
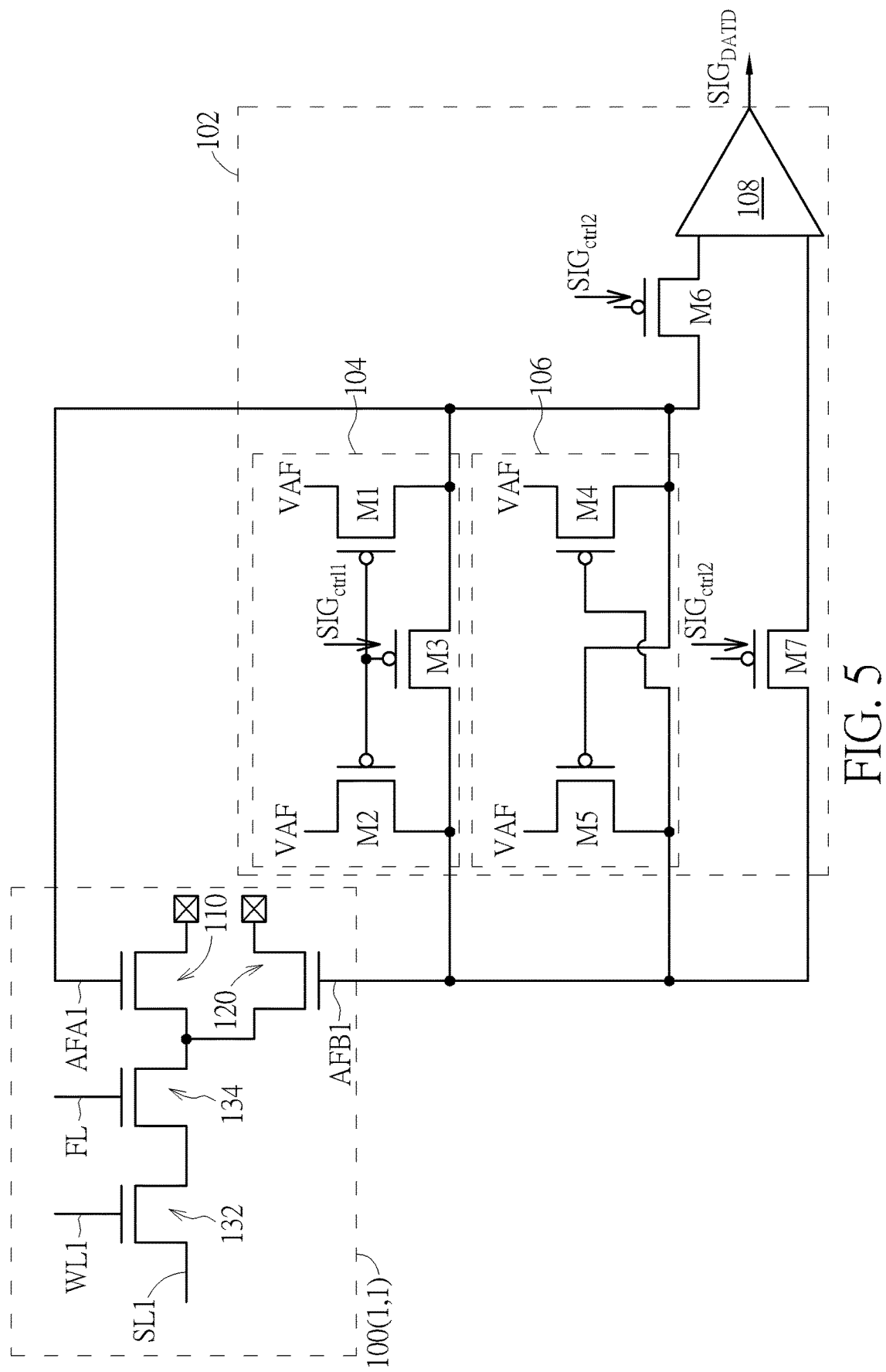
FIG. 5 shows a read control circuit according to one embodiment of the present invention.

FIG. 5 shows a read control circuit 102 according to one embodiment of the present invention. The read control circuit 102 can be used in the memory system 10 to sense the voltage difference between the first anti-fuse control line AFA1 and the second anti-fuse control line AFB1 for identifying the data stored in the memory cells 100(1,1) to 100(M,1).

The read control circuit 102 includes a pre-charge control circuit 104, a sensing assistant circuit 106, and a differential sensing amplifier 108.

In FIG. 5, the pre-charge control circuit 104 can be coupled to the first anti-fuse control line AFA1 and the second anti-fuse control line AFB1. The pre-charge control circuit 104 can pre-charge the first anti-fuse control line AFA1 and the second anti-fuse control line AFB1 to the voltage VAF during the read operation.

The sensing assistant circuit 106 can be coupled to the first anti-fuse control line AFA1 and the second anti-fuse control line AFB1. During the read operation, the sensing assistant circuit 106 can enhance the voltage difference between the first anti-fuse control line AFA1 and the second anti-fuse control line AFB1.

The differential sensing amplifier 108 can be coupled to the first anti-fuse control line AFA1 and the second anti-fuse control line AFB1. The differential sensing amplifier 108 can generate the data signal $SIG_{DATA}$ by comparing the voltages on the first anti-fuse control line AFA1 and the second anti-fuse control line AFB1.

The pre-charge control circuit 104 includes transistors M1, M2, and M3. The transistor M1 has a first terminal for receiving the voltage VAF, a second terminal coupled to the first anti-fuse control line AFA1, and a control terminal for receiving a control signal $SIG_{ctrl1}$. The transistor M2 has a first terminal for receiving the voltage VAF, a second terminal coupled to the second anti-fuse control line AFB1, and a control terminal coupled to the control terminal of the transistor M1. The transistor M3 has a first terminal coupled to the first anti-fuse control line AFA1, a second terminal coupled to the second anti-fuse control line AFB1, and a control terminal coupled to the control terminal of the transistor M1.

During the read operation, the control signal $SIG_{ctrl1}$ can turn on the transistors M1, M2, and M3. The transistors M1 and M2 can raise the voltages of the first anti-fuse control line AFA1 and the second anti-fuse control line AFB1 to the voltage VAF, and the transistor M3 can balance the voltages of the first anti-fuse control line AFA1 and the second anti-fuse control line AFB1. After the first anti-fuse control line AFA1 and the second anti-fuse control line AFB1 are pre-charged, the transistors M1, M2, and M3 can be turned off by the control signal $SIG_{ctrl1}$.

The sensing assistant circuit 106 includes transistors M4 and M5. The transistor M4 has a first terminal for receiving the voltage VAF, a second terminal coupled to the first anti-fuse control line AFA1, and a control terminal coupled to the second anti-fuse control line AFB1. The transistor M5 has a first terminal for receiving the voltage VAF, a second terminal coupled to the second anti-fuse control line AFB1, and a control terminal coupled to the first anti-fuse control line AFA1.

During the pre-charge process of the read operation, the sensing assistant circuit 106 can enhance the voltage difference between the first anti-fuse control line AFA1 and the second anti-fuse control line AFB1. For example, if the voltage of the first anti-fuse control line AFA1 is pulled down by the discharging current through the first anti-fuse element 110, the select transistor 132, and the following gate transistor 134 in the memory cell 100(1,1), the transistor M5 will be turned on to keep the voltage of the second anti-fuse control line AFB1 at the voltage VAF. Therefore, the voltages of the first anti-fuse control line AFA1 and the second anti-fuse control line AFB1 can be differentiated faster, and the data reading time required by the differential sensing amplifier 108 can be reduced.

In FIG. 5, the read control circuit 102 can further include transistors M6 and M7. The transistors M6 and M7 can control the electrical connection between the first anti-fuse control line AFA1 and the differential sensing amplifier 108 and the electrical connection between the second anti-fuse control line AFB1 and the differential sensing amplifier 108 according to the control signal $SIG_{ctrl2}$. The transistors M6 and M7 help to eliminate the loading of the first/second anti-fuse control lines AFA1/AFB1 to the input terminals of the differential sensing amplifier 108.

In FIG. 5, the read control circuit 102 can be used to read the data stored in the memory cells 100(1,1) to 100(M,N) individually by controlling the corresponding word lines WL1 to WLM. Also, in some embodiments, the memory system 10 can further include a reading decoder coupled to the first anti-fuse control lines AFA1 to AFAN and the second anti-fuse control lines AFB1 to AFBN, so that the read control circuit 102 can further be used to read the data stored in memory cells in different columns. However, in some embodiments, the memory system 10 can also include N read control circuits 20 for reading memory cells disposed in the same row but in N different columns at the same time without using the reading decoder.

In addition, in FIG. 1, the selection circuit 130 can include the following gate transistor 134 to relieve the high voltage received by the anti-fuse elements 110 and 120 so as to protect the select transistor 132 from being damaged. However, in some embodiments, if the select transistor 132 is able to endure such high voltage, then the following gate transistor 134 may be omitted.

Figure 6:
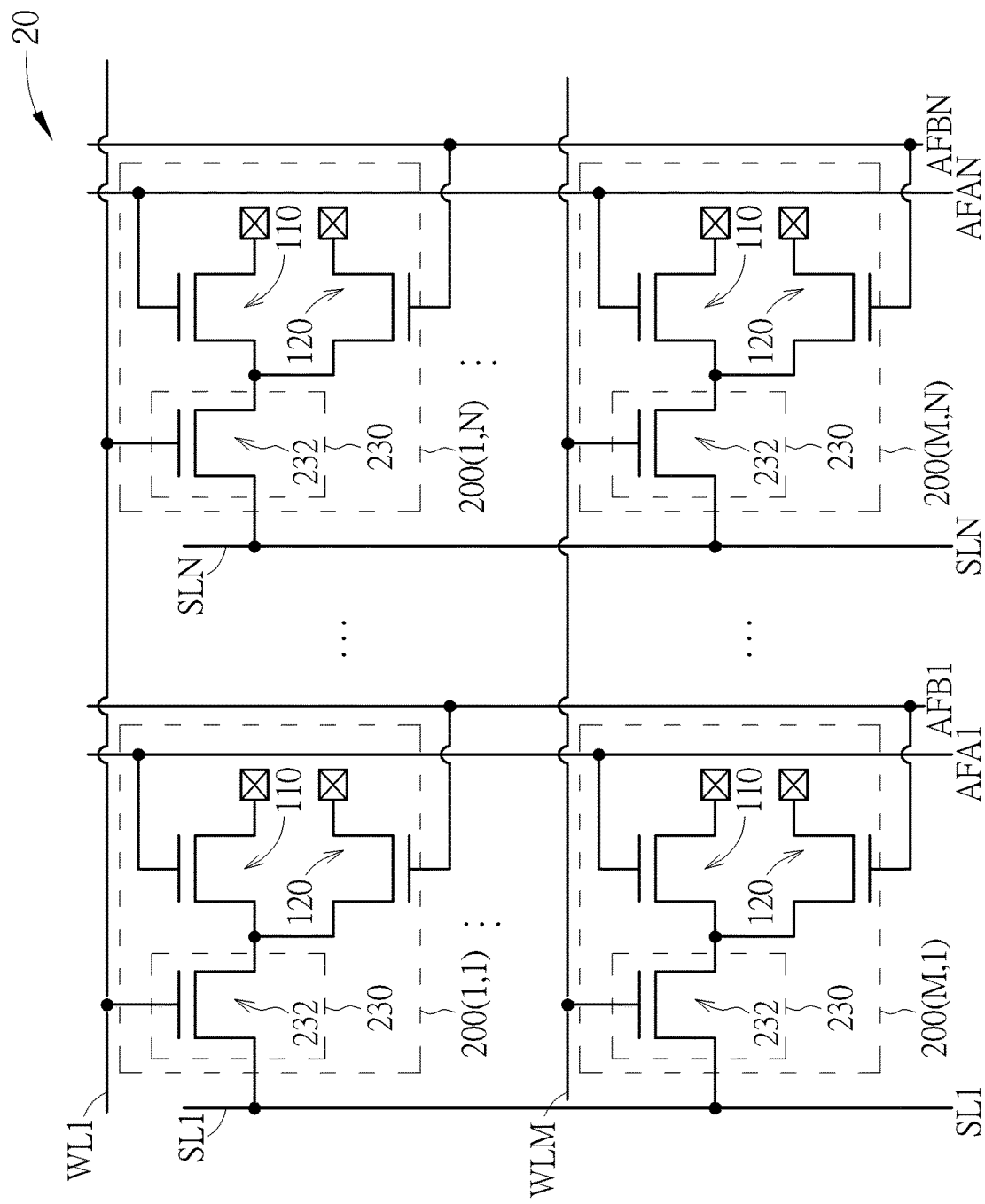
FIG. 6 shows a memory system according to another embodiment of the present invention.

FIG. 6 shows a memory system 20 according to one embodiment of the present invention. The memory system 10 and the memory system 20 have similar structures and can be operated with similar principles. However, the selection circuit 230 of the memory cells 200(1,1) to 200(M,N) can include the select transistor 232 only. In this case, the memory cells 200(1,1) to 200(M,N) can still be selected through the corresponding word line WL1, and the program operations and the read operations shown in FIGS. 2 to 4 can still be applied without the following gate transistor 134 and the following gate control line FL.

In summary, the memory cells and the memory systems provided by the embodiments of the present invention can store the data with two anti-fuse elements so the data can be read differentially without the reference voltage or the reference current required in prior art . Consequently, the accuracy of the read operation can be improved, and the reading time can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory cell comprising:
    a first anti-fuse element having a first terminal, a second terminal being floating, and a control terminal coupled to a first anti-fuse control line;
    a second anti-fuse element having a first terminal coupled to the first terminal of the first anti-fuse element, a second terminal being floating, and a control terminal coupled to a second anti-fuse control line; and
    a selection circuit coupled to the first terminal of the first anti-fuse element, the first terminal of the second anti-fuse element, and a source line, and configured to control an electrical connection from the source line to the first terminal of the first anti-fuse element and the first terminal of the second anti-fuse element.

2. The memory cell of claim 1, wherein the selection circuit comprises:
    a select transistor having a first terminal coupled to the source line, a second terminal, and a control terminal coupled to a word line; and
    a following gate transistor having a first terminal coupled to the second terminal of the select transistor, a second terminal coupled to the first terminal of the first anti-fuse element and the first terminal of the second anti-fuse element, and a control terminal coupled to a following gate control line.

3. The memory cell of claim 2, wherein during a program operation of the memory cell for programming a first type of data:
    the first anti-fuse control line is at a first voltage;
    the second anti-fuse control line is at a second voltage;
    the following gate control line is at the second voltage;
    the word line is at a third voltage;
    the source line is at a fourth voltage; and
    the first anti-fuse element is ruptured;
    wherein the first voltage is greater than the second voltage, the second voltage is greater than third voltage, and the third voltage is greater than the fourth voltage.

4. The memory cell of claim 2, wherein during a program operation of the memory cell for programming a second type of data:
    the second anti-fuse control line is at a first voltage;
    the first anti-fuse control line is at a second voltage;
    the following gate control line is at the second voltage;
    the word line is at a third voltage;
    the source line is at a fourth voltage; and
    the second anti-fuse element is ruptured;
    wherein the first voltage is greater than the second voltage, the second voltage is greater than third voltage, and the third voltage is greater than the fourth voltage.

5. The memory cell of claim 2, wherein during a read operation of the memory cell:
    the first anti-fuse control line and the second anti-fuse control line are pre-charged to a fifth voltage;
    the following gate control line and the word line are at a sixth voltage;
    the source line is at a fourth voltage; and
    the first anti-fuse control line and the second anti-fuse control line become floating for sensing after the first anti-fuse control line and the second anti-fuse control line are charged to the fifth voltage;
    wherein the fifth voltage is greater than the sixth voltage, the sixth voltage is greater than fourth voltage.

6. The memory cell of claim 1, wherein the selection circuit comprises:
    a select transistor having a first terminal coupled to the source line, a second terminal coupled to the first terminal of the first anti-fuse element and the first terminal of the second anti-fuse element, and a control terminal coupled to a word line.

7. The memory cell of claim 6, wherein during a program operation of the memory cell for programming a first type of data:
    the first anti-fuse control line is at a first voltage;
    the second anti-fuse control line is at a second voltage;
    the word line is at a third voltage;
    the source line is at a fourth voltage; and
    the first anti-fuse element is ruptured;
    wherein the first voltage is greater than the second voltage, the second voltage is greater than third voltage, and the third voltage is greater than the fourth voltage.

8. The memory cell of claim 6, wherein during a program operation of the memory cell for programming a second type of data:
    the second anti-fuse control line is at a first voltage;
    the first anti-fuse control line is at a second voltage;
    the word line is at a third voltage;
    the source line is at a fourth voltage; and
    the second anti-fuse element is ruptured;
    wherein the first voltage is greater than the second voltage, the second voltage is greater than third voltage, and the third voltage is greater than the fourth voltage.

9. The memory cell of claim 6, wherein during a read operation of the memory cell:
    the first anti-fuse control line and the second anti-fuse control line are pre-charged to a fifth voltage;
    the word line are at a sixth voltage;
    the source line is at a fourth voltage; and
    the first anti-fuse control line and the second anti-fuse control line become floating for sensing after the first anti-fuse control line and the second anti-fuse control line are charged to the fifth voltage;
    wherein the fifth voltage is greater than the sixth voltage, the sixth voltage is greater than fourth voltage.

10. A memory system comprising:
    a plurality of first anti-fuse control lines;
    a plurality of second anti-fuse control lines;
    a plurality of source lines; and
    a plurality of memory cells, a first memory cell of the plurality of memory cells comprising:
        a first anti-fuse element having a first terminal, a second terminal being floating, and a control terminal coupled to a corresponding first anti-fuse control line of the plurality of first anti-fuse control lines;
        a second anti-fuse element having a first terminal coupled to the first terminal of the first anti-fuse element, a second terminal being floating, and a control terminal coupled to a corresponding second anti-fuse control line of the plurality of second anti-fuse control lines; and a selection circuit coupled to the first terminal of the first anti-fuse element, the first terminal of the second anti-fuse element, and a first source line, and configured to control an electrical connection from the first source line to the first terminal of the first anti-fuse element and the first terminal of the second anti-fuse element.

11. The memory system of claim 10, further comprising:
a plurality of word lines; and
a following gate control line;
wherein the selection circuit comprises:
a select transistor having a first terminal coupled to the first source line, a second terminal, and a control terminal coupled to a first word line of the plurality of word lines; and
a following gate transistor having a first terminal coupled to the second terminal of the select transistor, a second terminal coupled to the first terminal of the first anti-fuse element and the first terminal of the second anti-fuse element, and a control terminal coupled to the following gate control line.

12. The memory system of claim 11, wherein during a program operation of the first memory cell for programming a first type of data:
the corresponding first anti-fuse control line is at a first voltage;
the corresponding second anti-fuse control line is at a second voltage;
the following gate control line is at the second voltage;
the first word line is at a third voltage;
the first source line is at a fourth voltage; and
the first anti-fuse element is ruptured;
wherein the first voltage is greater than the second voltage, the second voltage is greater than third voltage, and the third voltage is greater than the fourth voltage.

13. The memory system of claim 12, wherein during the program operation of the first memory cell:
a second word line coupled to a second memory cell of the plurality memory cells is at the fourth voltage; and
a second source line coupled to a third memory cell of the plurality memory cells is at the third voltage;
wherein the second memory cell is coupled to the first source line, and the third memory cell is coupled to the first word line.

14. The memory system of claim 11, wherein during a program operation of the first memory cell for programming a second type of data:
the corresponding second anti-fuse control line is at a first voltage;
the corresponding first anti-fuse control line is at a second voltage;
the following gate control line is at the second voltage;
the first word line is at a third voltage;
the first source line is at a fourth voltage; and
the corresponding second anti-fuse element is ruptured;
wherein the first voltage is greater than the second voltage, the second voltage is greater than third voltage, and the third voltage is greater than the fourth voltage.

15. The memory system of claim 11, wherein during a read operation of the first memory cell:
the corresponding first anti-fuse control line and the second anti-fuse control line are pre-charged to a fifth voltage;
the following gate control line and the first word line are at a sixth voltage;
the first source line is at a fourth voltage; and
the corresponding first anti-fuse control line and the second anti-fuse control line become floating for sensing after the first anti-fuse control line and the second anti-fuse control line are charged to the fifth voltage;
wherein the fifth voltage is greater than the sixth voltage, the sixth voltage is greater than fourth voltage.

16. The memory system of claim 10, further comprising:
a plurality of word lines;
wherein the selection circuit comprises:
a select transistor having a first terminal coupled to the first source line, a second terminal coupled to the first terminal of the first anti-fuse element and the first terminal of the second anti-fuse element, and a control terminal coupled to a first word line of the plurality of word lines.

17. The memory system of claim 16, wherein during a program operation of the first memory cell for programming a first type of data:
the corresponding first anti-fuse control line is at a first voltage);
the corresponding second anti-fuse control line is at a second voltage;
the first word line is at a third voltage;
the first source line is at a fourth voltage; and
the first anti-fuse element is ruptured;
wherein the first voltage is greater than the second voltage, the second voltage is greater than third voltage, and the third voltage is greater than the fourth voltage.

18. The memory system of claim 17, wherein during the program operation of the first memory cell:
a second word line coupled to a second memory cell of the plurality memory cells is at the fourth voltage; and
a second source line coupled to a third memory cell of the plurality memory cells is at the third voltage;
wherein the second memory cell is coupled to the first source line, and the third memory cell is coupled to the first word line.

19. The memory system of claim 16, wherein during a program operation of the first memory cell for programming a second type of data:
the corresponding second anti-fuse control line is at a first voltage;
the corresponding first anti-fuse control line is at a second voltage;
the first word line is at a third voltage;
the first source line is at a fourth voltage; and
the second anti-fuse element is ruptured;
wherein the first voltage is greater than the second voltage, the second voltage is greater than third voltage, and the third voltage is greater than the fourth voltage.

20. The memory system of claim 16, wherein during a read operation of the first memory cell:
the corresponding first anti-fuse control line and the second anti-fuse control line are pre-charged to a fifth voltage;
the first word line are at a sixth voltage;
the first source line is at a fourth voltage; and
the corresponding first anti-fuse control line and the second anti-fuse control line become floating for sensing after the first anti-fuse control line and the second anti-fuse control line are charged to the fifth voltage;
wherein the fifth voltage is greater than the sixth voltage, the sixth voltage is greater than fourth voltage.

21. The memory system of claim 20 further comprising a read control circuit comprising:
- a pre-charge control circuit coupled to the corresponding first anti-fuse control line and the corresponding second anti-fuse control line, and configured to pre-charge the corresponding first anti-fuse control line and the corresponding second anti-fuse control line to the fifth voltage during the read operation of the first memory cell;
- a sensing assistant circuit coupled to the corresponding first anti-fuse control line and the corresponding second anti-fuse control line, and configured to differentiate voltages on the corresponding first anti-fuse control line and the corresponding second anti-fuse control line during the read operation of the first memory cell;
- a differential sensing amplifier coupled to the corresponding first anti-fuse control line and the corresponding second anti-fuse control line, and configured to generate a data signal by comparing the voltages on the corresponding first anti-fuse control line and the corresponding second anti-fuse control line.

22. The memory system of claim 21, wherein the pre-charge control circuit comprising:
- a first transistor having a first terminal configured to receive the fifth voltage, a second terminal coupled to the corresponding first anti-fuse control line, and a control terminal configured to receive a control signal;
- a second transistor having a first terminal configured to receive the fifth voltage, a second terminal coupled to the corresponding second anti-fuse control line, and a control terminal coupled to the control terminal of the first transistor; and
- a third transistor having a first terminal coupled to the corresponding first anti-fuse control line, a second terminal coupled to the corresponding second anti-fuse control line, and a control terminal coupled to the control terminal of the first transistor.

23. The memory system of claim 21, wherein the sensing assistant circuit comprising:
- a fourth transistor having a first terminal configured to receive the fifth voltage, a second terminal coupled to the corresponding first anti-fuse control line, and a control terminal coupled to the corresponding second anti-fuse control line; and
- a fifth transistor having a first terminal configured to receive the fifth voltage, a second terminal coupled to the corresponding second anti-fuse control line, and a control terminal coupled to the corresponding first anti-fuse control line.

* * * * *